United States Patent
Allemand

(10) Patent No.: US 9,318,724 B2
(45) Date of Patent: Apr. 19, 2016

(54) DEVICES INCLUDING, METHODS USING, AND COMPOSITIONS OF REFLOWABLE GETTERS

(71) Applicant: Osram Opto Semiconductors GmbH, Regensburg (DE)

(72) Inventor: Pierre-Marc Allemand, San Jose, CA (US)

(73) Assignee: OSRAM OLED GmbH, Regensberg (DE)

( * ) Notice: Subject to any disclaimer, the term of this patent is extended or adjusted under 35 U.S.C. 154(b) by 0 days.

(21) Appl. No.: 14/561,754

(22) Filed: Dec. 5, 2014

(65) Prior Publication Data

US 2015/0139864 A1 May 21, 2015

Related U.S. Application Data

(60) Division of application No. 13/633,332, filed on Oct. 2, 2012, now Pat. No. 8,905,808, which is a continuation of application No. 13/193,033, filed on Jul. 28, 2011, now Pat. No. 8,310,154, which is a continuation of application No. 11/845,719, filed on Aug. 27, 2007, now Pat. No. 8,013,526, which is a division of application No. 10/606,726, filed on Jun. 26, 2003, now abandoned.

(60) Provisional application No. 60/457,404, filed on Mar. 24, 2003.

(51) Int. Cl.
*H01L 51/52* (2006.01)
*B81C 1/00* (2006.01)
*H01L 23/26* (2006.01)
*H01L 51/56* (2006.01)

(52) U.S. Cl.
CPC ........ *H01L 51/5259* (2013.01); *B81C 1/00285* (2013.01); *H01L 23/26* (2013.01); *H01L 51/524* (2013.01); *H01L 51/5237* (2013.01); *H01L 51/56* (2013.01); *H01L 2924/0002* (2013.01); *H01L 2924/12044* (2013.01); *Y10T 428/24* (2015.01); *Y10T 428/24612* (2015.01)

(58) Field of Classification Search
CPC .. B22F 2998/10; B22F 1/0022; B22F 1/0018; H01L 23/26
See application file for complete search history.

(56) References Cited

U.S. PATENT DOCUMENTS

| | | | |
|---|---|---|---|
| 4,671,889 | A | 6/1987 | Schreiner et al. |
| 4,950,193 | A | 8/1990 | Jang |
| 5,156,563 | A | 10/1992 | Park et al. |

(Continued)

*Primary Examiner* — Anne Hines
(74) *Attorney, Agent, or Firm* — Fish & Richardson P.C.

(57) ABSTRACT

Methods for protecting circuit device materials, optoelectronic devices, and caps using a reflowable getter are described. The methods, devices and caps provide advantages because they enable modification of the shape and activity of the getter after sealing of the device. Some embodiments of the invention provide a solid composition comprising a reactive material and a phase changing material. The combination of the reactive material and phase changing material is placed in the cavity of an electronic device. After sealing the device by conventional means (epoxy seal for example), the device is subjected to thermal or electromagnetic energy so that the phase changing material becomes liquid, and consequently: exposes the reactive material to the atmosphere of the cavity, distributes the getter more equally within the cavity, and provides enhanced protection of sensitive parts of the device by flowing onto and covering these parts, with a thin layer of material.

12 Claims, 4 Drawing Sheets

(56) References Cited

U.S. PATENT DOCUMENTS

| | | |
|---|---|---|
| 5,244,707 A | 9/1993 | Shores |
| 5,304,419 A | 4/1994 | Shores |
| 5,308,533 A | 5/1994 | Hotaling et al. |
| 5,401,536 A | 3/1995 | Shores |
| 5,591,379 A | 1/1997 | Shores |
| 5,840,142 A | 11/1998 | Stevenson et al. |
| 6,059,860 A | 5/2000 | Larson |
| 6,077,404 A | 6/2000 | Wang et al. |
| 6,112,888 A | 9/2000 | Sauro et al. |
| 6,124,006 A | 9/2000 | Hekal |
| 6,180,708 B1 | 1/2001 | Chu |
| 6,226,890 B1 | 5/2001 | Boroson et al. |
| 6,299,689 B1 | 10/2001 | Wang et al. |
| 6,322,720 B1 * | 11/2001 | Reutova ............ B22F 9/20 252/181.6 |
| 6,407,408 B1 | 6/2002 | Zhou et al. |
| 6,470,594 B1 | 10/2002 | Boroson et al. |
| 6,562,452 B2 | 5/2003 | Ferri |
| 6,737,176 B1 | 5/2004 | Otsuki et al. |
| 6,777,481 B2 | 8/2004 | Chu |
| 6,835,950 B2 | 12/2004 | Brown et al. |
| 6,843,936 B1 | 1/2005 | Jacobs |
| 6,936,131 B2 | 8/2005 | McCormick et al. |
| 6,967,640 B2 | 11/2005 | Albert et al. |
| 7,198,515 B2 | 4/2007 | Matsueda et al. |
| 7,309,747 B2 | 12/2007 | Minami et al. |
| 7,589,465 B2 | 9/2009 | Carr |
| 2001/0033946 A1 | 10/2001 | Mashiko et al. |
| 2002/0011783 A1 | 1/2002 | Hosokawa |
| 2002/0155320 A1 | 10/2002 | Park et al. |
| 2002/0158835 A1 | 10/2002 | Kobayashi et al. |
| 2002/0181866 A1 | 12/2002 | Crook et al. |
| 2003/0039859 A1 * | 2/2003 | Ohata ............ H01L 51/5237 428/690 |
| 2003/0143423 A1 * | 7/2003 | McCormick ........ H01L 51/5237 428/690 |
| 2004/0099862 A1 | 5/2004 | Suzuki et al. |
| 2004/0108811 A1 | 6/2004 | Klausmann et al. |
| 2007/0205720 A1 | 9/2007 | Sparks et al. |
| 2009/0174304 A1 | 7/2009 | Kanazawa et al. |

* cited by examiner

DEVICES INCLUDING, METHODS USING, AND COMPOSITIONS OF REFLOWABLE GETTERS

CROSS-REFERENCE TO RELATED APPLICATIONS

This application is a divisional of, and claims the benefit of priority of, U.S. application Ser. No. 13/633,332, filed on Oct. 2, 2012, which is a continuation of U.S. application Ser. No. 13/193,033, filed Jul. 28, 2011, now U.S. Pat. No. 8,310,154, which is a continuation of U.S. application Ser. No. 11/845,719, filed Aug. 27, 2007, now U.S. Pat. No. 8,013,526, which is a divisional of U.S. application Ser. No. 10/606,726, filed Jun. 26, 2003, now abandoned, which claims the benefit of U.S. Provisional Application No. 60/457,404, filed Mar. 24, 2003. The disclosure of the prior applications are considered part of (and are incorporated by reference in their entirety in) the disclosure of this application.

FIELD OF THE INVENTION

The invention relates generally to the field of microelectronics fabrication. More particularly, the invention relates to gettering of moisture, oxygen and other harmful species in encapsulated microelectronics devices.

BACKGROUND OF THE INVENTION

Microelectronics devices including Organic Light Emitting Diodes (OLEDs) contain thin layers of materials very sensitive to oxygen and moisture. These devices are typically encapsulated, and a getter is usually placed in the cavity of these devices. The getter can be a zeolite tablet or powder, an oxide (BaO, CaO), or a reactive metal (such as Ba and its alloys with other metals such as Al). Once the zeolites have been activated at high temperature, they must be handled and processed under rigorously dry conditions. Reactive metals and oxides must also be handled under controlled conditions so they do not react or lose their activity.

Various aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore non-limiting, embodiments.

DESCRIPTION OF PREFERRED EMBODIMENTS

The invention and the various features and advantageous details thereof are explained more fully with reference to the embodiments that are illustrated in the accompanying drawings and detailed in the following description of preferred embodiments. Descriptions of well-known components and processing techniques are omitted so as not to unnecessarily obscure the invention in detail.

The term coupled, as used herein, is defined as connected, although not necessarily directly, and not necessarily mechanically. The term substantially, as used herein, is defined as approximately (e.g., preferably within 10% of, more preferably within 1% of, most preferably within 0.1% of).

Methods for Protecting Circuit Device Materials

Figure 1A:
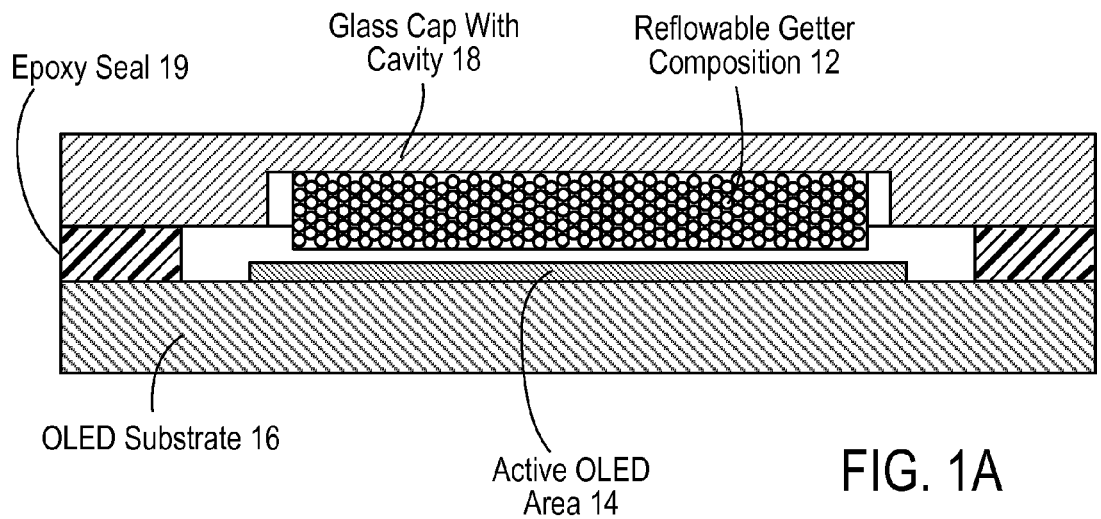
FIG. 1A illustrates placement of an activated powder and molten wax getter composition within an encapsulated device prior to reflow, representing an embodiment of the invention.
Figure 1B:
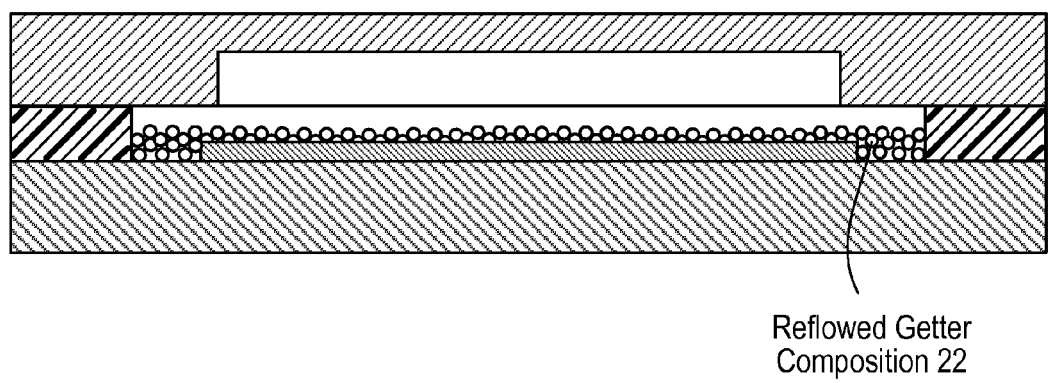
FIG. 1B illustrates placement of an activated getter and molten wax getter composition within an encapsulated device after reflow of the getter composition, representing an embodiment of the invention.

Some embodiments according to a first aspect of the invention provide a method for protecting circuit device materials. Examples of these embodiments are depicted in FIGS. 1A, 1B, 3A, 3B, 4A, 4B, and 4C. The method comprises mixing a reactive material 12A with a comparatively inert material 12B to form a getter 12; placing the getter in the device 10; applying energy to the getter; and responsive to applying the energy, distributing the getter inside the device. The comparative inertness is relative to the reactive material. For some embodiments as shown in FIG. 1B, a reflowed getter composition 22 covers an active OLED area 14. The reflowed getter composition can also be used to cover active areas of other optoelectronic devices including light detector arrays or solar cell arrays. The inert material 12B can comprise a binder. The placing can be accomplished by automated means.

Figure 3A:
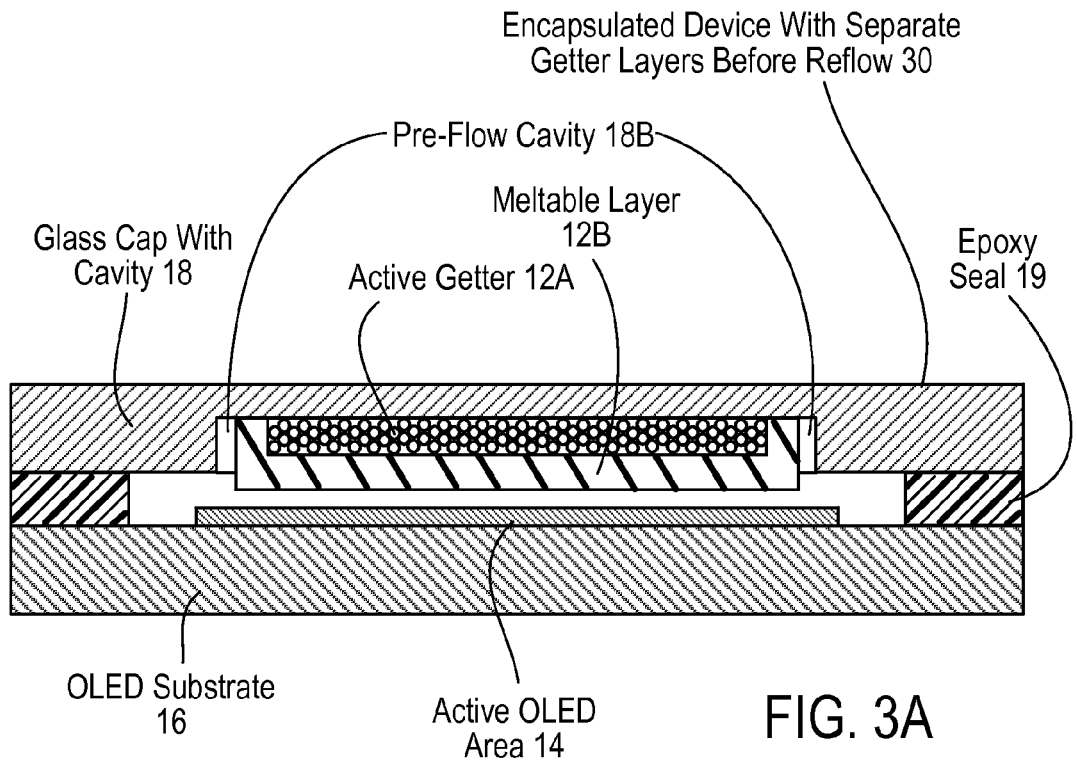
FIG. 3A illustrates a microelectronics device assembly including the cap of FIG. 2C, representing an embodiment of the invention.
Figure 3B:
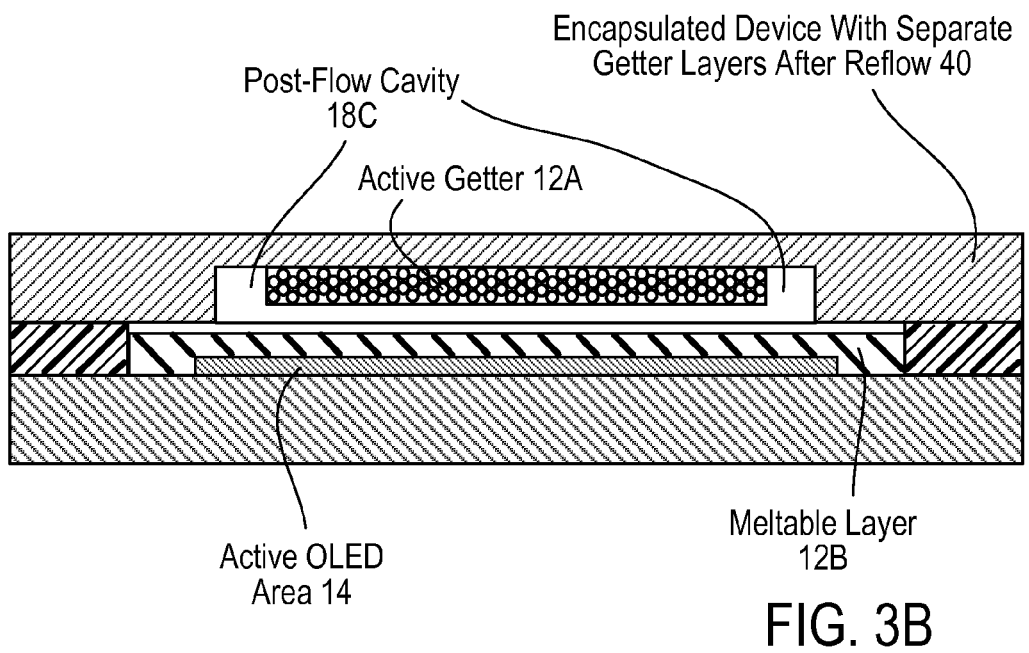
FIG. 3B illustrates a microelectronics device assembly after the inert layer has been removed from the active getter, representing an embodiment of the invention.
Figure 4A:
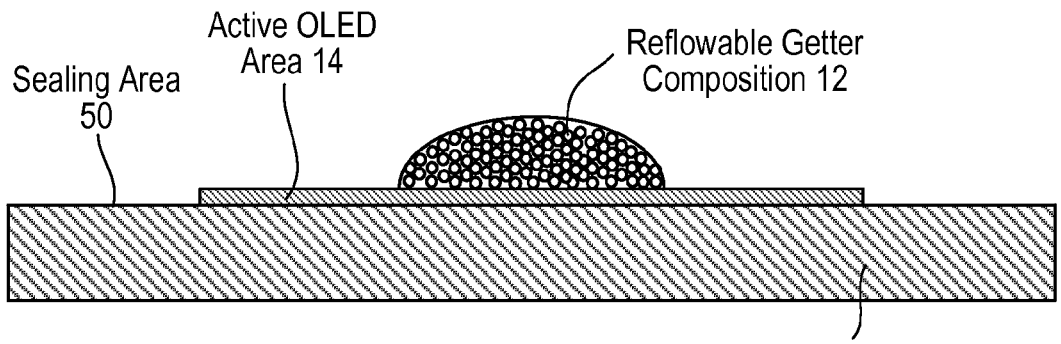
FIG. 4A illustrates the placement of a reflowable getter composition onto a microelectronic device prior to encapsulation, representing an embodiment of the invention.
Figure 4B:
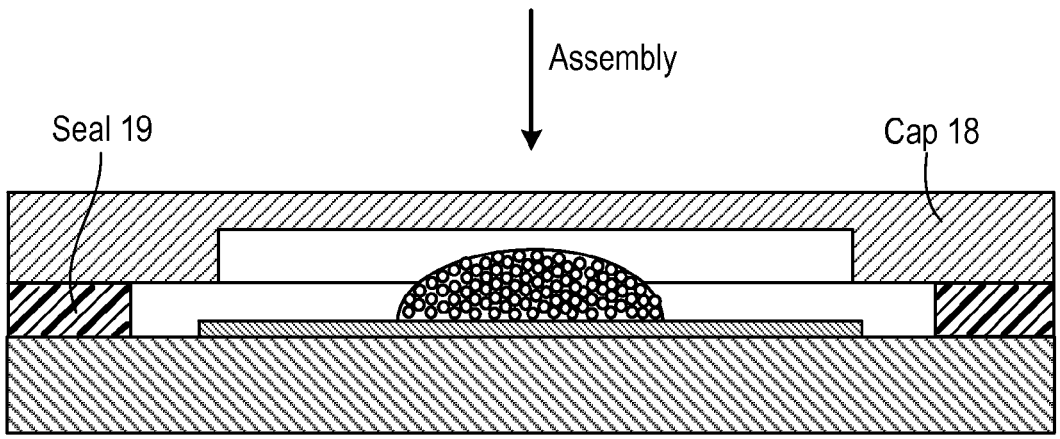
FIG. 4B illustrates a microelectronic device assembly with the getter composition after encapsulation, and sealing.
Figure 4C:
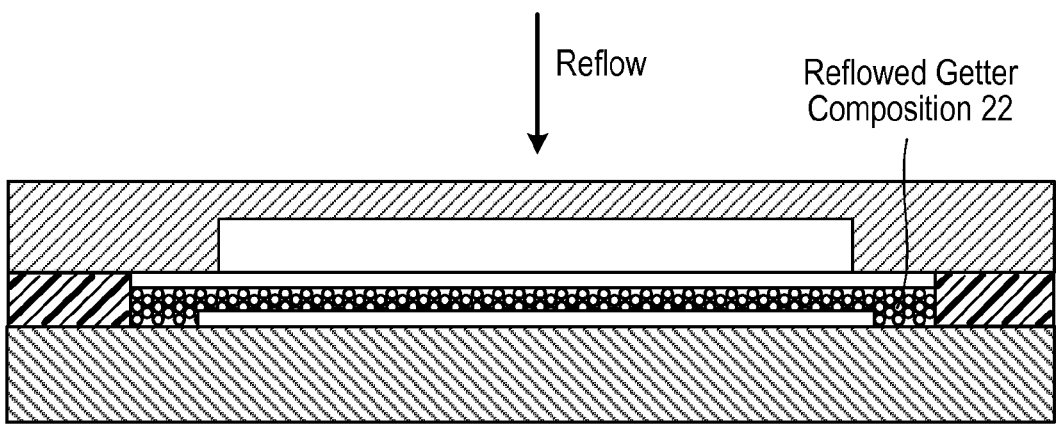
FIG. 4C illustrates a microelectronic device assembly after reflow of the getter composition so that the getter composition covers the entire active area of the microelectronic device.

In some embodiments, as depicted in FIGS. 1B, 3B and 4C, the method for protecting circuit device materials further comprises sealing the device. For these embodiments, the device can comprise an optoelectronic device. The optoelectronic device can include a substrate 16 and an active OLED area 14.

For some of these embodiments, placing the getter 12 can include placing the getter on a surface of a cap 18, sealing the device includes joining the cap to the substrate. Distributing the getter 12 can include transferring at least a portion of the getter to cover the active OLED area 14. Transferring at least a portion of the getter 12 to cover the active OLED area 14 can include heating the getter to a temperature in the range of 75 to 300 degrees Celsius, and can provide an encapsulated device after reflow of the getter 20 as shown in FIG. 1B. The portion of the getter 12 transferred to cover the active OLED area 14 can be greater than approximately eighty percent. The active OLED area 14 can include a central portion and a periphery. Distributing the getter 12 can include covering at least 50% of the periphery of the active OLED area 14. The distributing can occur after final assembly of an encapsulated device before reflow of the getter 10 as shown in FIG. 1A.

Some embodiments according to a second aspect of the invention provide a method for protecting circuit device materials. Examples of these embodiments are depicted in FIGS. 3A and 3B. The method comprises placing a reactive material 12A on an interior surface of the device 10; placing a meltable material 12B upon the reactive material to substantially cover the reactive material; and in response to an application of energy to the meltable material, removing at least a portion of the meltable material, the removing exposing at least a portion of the reactive material. The circuit device can comprise an optoelectronic device including an active OLED area 14. The removing step can include heating the meltable material 12B to a temperature in the range of 75 to 300 degrees Celsius. The removing step can further comprise covering substantially all of the active OLED area 14 with the meltable material 12B. The method can further comprise sealing the device.

The methods for protecting circuit devices according to some embodiments of this invention provide more flexible handling of the getter 12 during fabrication of optoelectronic devices. The comparative size and shape of a getter 12 with respect to the size and shape of the encapsulating cavity has an impact on the performance of the getter, and thus potentially the degradation of the optoelectronic device. For example, for large area but very thin devices such as flat panel displays, the permeation of water vapor and other potentially harmful gaseous species through the seal 19 may cause some non-uniform degradation of the display at the periphery of the device if the getter 12 is placed only at the center of the device. The present invention enables modification of the shape and activity of the getter 12 after sealing of the device.

Optoelectronic Devices

Some embodiments according to a third aspect of the invention provide an optoelectronic device. Examples of these embodiments are depicted in FIGS. 1B, 3B and 4C. The optoelectronic device comprises a substrate 16; an active device area placed on the substrate; and a getter 12. The getter 12 includes a first material 12B and a reactive material 12A. The first material 12B can be adapted to respond to energy input by at least one of: melting, phase change, or morphological change. An example of the active device area is shown in FIG. 3B as an active OLED area 14.

The optoelectronic device can further comprise a seal 19 joining the substrate 16 to a cap 18. The at least one of: melting, phase change, and morphological change can result in reflowing of the first material 12B. Prior to the reflowing, the getter 12 can be disposed on a recessed surface of the cap 18. After the reflowing, the getter 12 can be disposed to cover a substantial portion of the active OLED area 14.

The first material 12B can comprise at least one of paraffin wax, low-density polyethylene, or Elvax☐ resin. Alternatively, the first material 12B can comprise a binder, and the reactive material 12A can be substantially dispersed within the binder.

Cap

Some embodiments according to a fourth aspect of the invention provide a cap 18 for enclosing an optoelectronic device. Examples of these embodiments are depicted in FIG. 2C. The cap 18 comprises a reactive material 12A disposed on a cap surface; and an inert material 12B placed to cover more than approximately fifty percent of the reactive material. The inert material 12B can be adapted to flow in response to application of energy to the inert material. The cap 18 can include an interior surface having a recessed portion. The inert material 12B can cover at least some of the recessed portion. In response to the application of energy, the inert material 12B can melt. The inert material 12B can cover less than the entire recessed portion thereby leaving a cavity between the inert material and at least one sidewall 18D of the recessed portion.

Getter Composition

Some embodiments according to a fifth aspect of the invention provide a getter composition. Examples of these embodiments are depicted in FIGS. 1B, 2C, 3A, and 4C. As shown in FIG. 1B, the reflowable getter composition 12 can be formed as a reactive material 12A dispersed within an inert binder 12B. As shown in FIG. 2C, the getter composition can comprise: a reactive material 12A disposed in an encapsulated device 10, and an inert material 12B disposed in the encapsulated device. The reactive material 12A is more reactive than at least one device material to desorbed matter and matter from a space within the device. The desorbed matter can be desorbed from at least one of: a substrate, a film disposed upon the substrate, and an encapsulation surface. The inert material 12B can be adapted to respond to energy input by at least one of: melting, phase change, or morphological change. The reactive material 12A can comprise an activated powder containing at least one of activated alumina, silica, zeolite, barium oxide, calcium oxide, calcium, and barium. The inert material 12B can comprise at least one of paraffin wax, low-density polyethylene, or Elvax® resin. The inert material 12B can comprise a binder, and the reactive material 12A, e.g. activated powder can be mixed with the binder so that the reactive material is substantially dispersed in the binder.

In some embodiments, the inert material 12B responds to energy input by melting. Upon removal of the energy, the inert material 12B solidifies. In some of these embodiments, each device material is adapted to provide enhanced performance of an optoelectronic device.

Preparation of the Getter

Preparation of the Getter according to some embodiments of the invention, as exemplified in FIGS. 1A, 1B, 1C, 4A, 4B and 4C, is as follows:

A getter 12 comprised of an reactive material 12A (activated powder) mixed with a inert material 12B (binder) is selected to provide an equilibrium minimum humidity level lower than a humidity level to which the OLED device is sensitive when sealingly enclosed by an enclosure containing the getter;

The activated powder can have a particle size range of about 0.1 to about 200 micrometers.

The binder can be chosen for dispersing the selected activated powder therein. The inert material 12B (binder) can be chosen from various classes of materials so that the binder can have a low moisture absorption rate; e.g., if the binder is selected from non polar hydrocarbons such as waxes, paraffins, polyolefins. Alternatively, the inert material 12B (binder) can have a higher moisture absorption rate if selected from more polar materials such as low molecular weight acrylates, polyurethanes, polyamides. During reflow of the inert material 12B, the moisture absorption rate of the binder may change.

The inert material 12B can be selected so that a blend can be formed of the reactive material 12A (activated powder) and the inert material 12B (e.g., wax) in a preferred weight fraction of the activated powder in the blend in a range of approximately 10% to 90%.

A measured amount of the getter 12 blend can then be applied on a portion of the upper interior surface of a glass cap 18 by dispensing a measured amount of the getter 12 blend above the blend's melting point with a heated syringe dispensing system until the dispensed blend has spread along the interior surface to form a reflowable getter layer 12. However, because the blend can be re-melted after final assembly of the device, the dispensed blend can have any shape (such as a droplet), so that there is no need to initially dispense the blend uniformly onto the surface of the enclosure. The layer is then cooled to about room temperature until it solidifies to form a solid getter 12 layer, so that the getter layer has the desired getter layer thickness (t) and covers the desired surface. Alternatively, the getter 12 composition can be shaped as a thin pellet whose shape and dimension are such that the pellet can fit in the cavity of the device to be protected, and this pellet can be placed inside the device cavity. The pellet can be placed directly on top of the active OLED area 14, or in the cap 18. The placement can be accomplished either manually or through use of automatic pick-and-place equipment.

The preparation of the getter 12 according to other embodiments of the invention, as shown in FIGS. 2C, 3A, and 3B, is as follows:

A reactive material 12A, e.g., an active getter, is selected to provide an equilibrium minimum humidity level lower than a humidity level to which the device is sensitive when sealingly enclosed by an enclosure containing the active getter.

The reactive material 12A can be a reactive metal such as barium. Reactive material 12A can be deposited onto the cap 18 by physical vapor deposition techniques, e.g., thermal evaporation or sputter deposition; or by chemical vapor deposition techniques. For some embodiments, reactive material 12A can be a finely-divided powder of a reactive metal or an alkaline metal oxide and has a preferred particle size range of about 0.1 to about 200 micrometers. In some embodiments the particle size range is from 0.3 to 50 micrometers.

A meltable inert material 12B, e.g., a molten wax, can be chosen for coating the reactive material 12A before reflow, and for coating the active OLED area 14 after reflow.

A measured amount of the reactive material 12A can be applied on a portion of the recessed interior surface of the cap 18, for example by evaporation of a reactive metal, until the reactive material 12A has formed a layer along the desired area of the recessed portion of the interior surface of the cap. Prior to placement of the reactive material 12A on the cap 18, the cap has a pre-getter placement cavity 18A. In some embodiments the portion of the recessed interior surface covered by the reactive material 12A is in a range of 25% to 90%. Depending on the permeation rate of the seal 19, the permeation rate of the inert material 12B, the reaction rate of the reactive material 12A, and the reaction rate of the active area 14 to be protected, the portion of the inner surface covered by the reactive material 12A can be in the range of 10% to 99%. As shown in FIG. 2C and FIG. 3A, a volume of space underneath the cap after application of reactive material 12A is bounded by a cap sidewall 18D and the lateral extent of the inert material 12B, and is referred to as the pre-reflow cavity 18B. As shown in FIG. 3B, inert material 12B has transferred to the active OLED area 14, the remaining reactive material 12A extends towards the sidewall 18D, and the volume of space underneath cap is referred to as the post re-flow cavity 18C. In some embodiments, the reactive material 12A layer has a thickness in the range of about 0.1 micron to 10 microns.

Under controlled conditions (e.g., low moisture atmosphere) a measured amount of inert material 12B, e.g., meltable material, is then placed upon the reactive material 12A (active getter). The meltable inert material 12B covers substantially all of the reactive material 12A, and in some embodiments also extends to cover a portion of the recessed portion of the interior surface of the cap 18. Typically, the meltable inert material 12B does not cover the entire length of the recessed portion of the interior surface. Once the reactive material 12A has been covered with the meltable inert material 12B, the active getter layer becomes much less susceptible to deactivation by ambient conditions (i.e., the active getter layer is less susceptible to loss of gettering capacity due to reactions with ambient gases), and thus the caps can be easier to handle in a mass production process. The reactive material 12A can be uncovered by melting and displacing the meltable inert material 12B as needed to regain its gettering function.

EXAMPLES

Specific embodiments of the invention will now be further described by the following, non-limiting examples which will serve to illustrate in some detail various features of significance. The examples are intended merely to facilitate an understanding of ways in which the invention may be practiced and to further enable those of skill in the art to practice the invention. Accordingly, the examples should not be construed as limiting the scope of the invention.

Example 1

As shown in FIGS. 1A and 1B, a reflowable getter composition 12 can be made (under controlled conditions, e.g, using a glove box where the oxygen and moisture concentration can be reduced to a very low level when mixing a reactive material 12A (e.g., activated powder) with an inert material 12B (e.g., molten wax). The activated powder 12A can be activated silica gel, alumina, activated zeolite powder, barium oxide (BaO) or other alkaline earth metal oxides, or barium (Ba) powder or other alkaline metals or alkaline earth metals. The inert material 12B can be natural or synthetic waxes, paraffin waxes, microcrystalline waxes, polyolefin resin waxes such as polyethylene, polypropylene, polybutene, polyethylene oxide, polypropylene oxide and their copolymers such as Elvax® resin from DuPont; ester waxes, polyurethane waxes, silicone resin waxes. The getter composition 12 can be shaped as a thin tablet and placed into the enclosure of the device to be protected, such as encapsulated device before reflow 10.

The encapsulated device before reflow 10 is then sealed. In some embodiments as shown in FIG. 1A, the sealed encapsulated device before reflow 10 includes: reflowable getter composition 12, an active OLED area 14, an OLED substrate 16, a glass cap with a cavity 18, and at least one epoxy seal 19.

Upon further processing, for example heating, the reflowable getter composition 12 can melt and distribute itself evenly inside the device to form an encapsulated device after getter reflow 20, as shown in FIG. 1B. In some optoelectronic devices where the thickness of the cavity is very small compared to the width and length of the device such as a flat panel display, it may be preferable that the getter material be uniformly distributed on the entire inner surface of the device. It has been observed that the shape of the getter material is important to protect such a display from degradation. If the getter material is placed in the center of the display, some degradation is observed on the periphery of the active area of the display. If the getter composition can be melted so that it distributes itself evenly inside the cavity, the periphery of the active layers of the display will be better protected since any moisture of oxygen permeating inside the device through the epoxy seal on the periphery will react first with the getter material.

Example 2

Figure 2A:
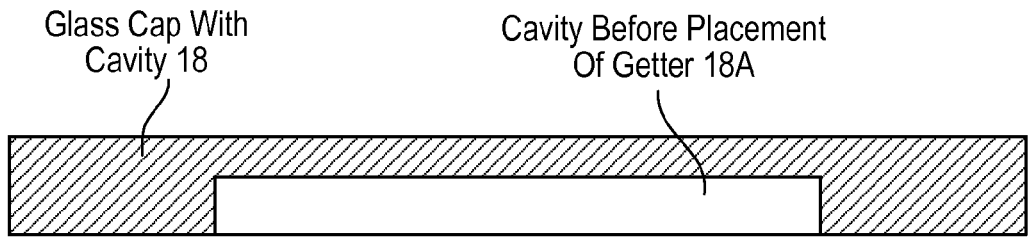
FIG. 2A illustrates a prior art glass cap with a cavity.
Figure 2B:
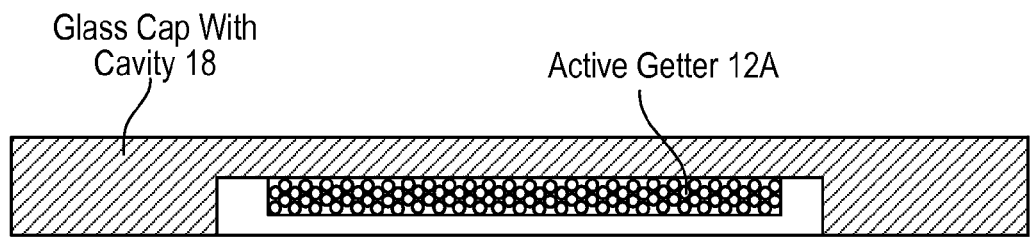
FIG. 2B illustrates a glass cap including an active getter, according to an embodiment of the invention.
Figure 2C:
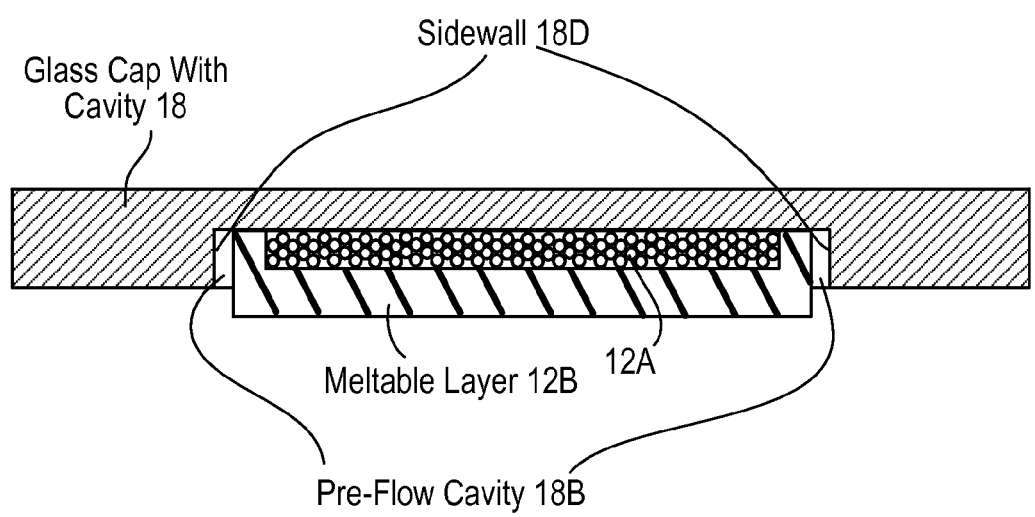
FIG. 2C illustrates a glass cap including an active getter and an adjacent binder layer, representing an embodiment of the invention.

According to some embodiments of the invention and as shown in FIG. 2B, an reactive material 12A can be deposited (by evaporation or other means) onto a glass cap 18. The active getter can be a reactive metal, such as barium. As shown in FIG. 2C, the reactive material 12A can then be protected with a thin film of a metlable inert layer 12B, such as paraffin wax, so that the cap 18 can be manufactured and handled easily.

As shown in FIGS. 3A and 3B, the cap 18 can then be used to encapsulate a device, using an epoxy seal 19 or other conventional means. The assembly is then subjected to thermal, or other, energy so that the metlable inert layer 12B melts, exposing the reactive material 12A to the atmosphere of the device on the one hand, and further protecting the active parts of the device by covering the inside of the device with a thin layer of wax, as shown in FIG. 3B.

Preparation and Sealing of OLEDs with Reflowable Getters

The reflowable getter 12 can be advantageously used in the production of OLEDs. An appropriate amount of the getter 12 composition as described in Example 1 can be dispensed as a hot liquid onto a glass or a metal cap 18 with a heated syringe and cooled down to room temperature so that the liquid getter composition solidifies. The substrate 16 having the active OLED area 14 can then be sealed with this cap 18 using a sealant such as a UV-curable epoxy adhesive. Once cured, the OLED assembly can be heated above the melting point of the inert material 12B (wax/binder), thus causing the reflowable getter composition to flow inside the entire inner cavity, and evenly distributing the getter particles inside the device cavity. For some embodiments, the inert material 12B (e.g., wax or binder) can wet and spread itself inside the device cavity because of the inert material's low surface tension, especially where the getter 12, in its molten state, is reasonably fluid and does not behave as a thixotropic liquid. In addition, the inert material 12B (e.g., wax) can provide additional protection to the active OLED area 14.

Alternatively, the reflowable getter 12 can be placed (as a liquid droplet or as a solid tablet) directly on top of the active OLED area 14, as shown in FIG. 4A. The cap 18 can then be placed onto the OLED device with the appropriate sealant such as a UV-curable epoxy. For some embodiments, the sealing surfaces in contact with the sealing material are preferably very clean and not contaminated with materials used in the manufacturing process of the active OLED area, such as photoresists, solvents, or organic light emitting materials. Typically, the sealing area is cleaned by an ablation process just before encapsulation. After assembly and sealing of the device, the reflowable getter 12 can be heated above its melting point, causing the getter to flow inside the cavity up to the edge of the sealing area. Such edge coverage is otherwise difficult to achieve without the risk of contaminating the sealing area.

The effectiveness of a getter 12 in an OLED device can be evaluated by measuring the dimensions of the light emitting areas (pixels) after exposure to a testing environment, with respect to the initial light emitting areas. Typically, the shrinkage of the light emitting areas is more severe at the periphery of the OLED display, close to the sealing area, especially when the getter is placed at the center of the cap. Uniformly reflowing the getter 12 inside the OLED cavity, provides more uniform shrinkage of the light emitting areas. In addition, the inert binder material 12B provides additional protection to the active OLED area, in the case where the inert binder material has been reflowed over the active OLED area 14, as shown in FIGS. 3B and 4C.

Various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended subclaims.

What is claimed is:

1. A cap comprising a getter, the cap further comprising:
a reactive material disposed on a cap surface; and
an inert material that covers more than approximately fifty percent of the reactive material,
wherein the inert material is adapted to flow in response to application of energy to the inert material,
wherein the cap comprises an interior surface having a recessed portion;
wherein the inert material covers less than the entire recessed portion; and
wherein a cavity is positioned between the inert material and at least one sidewall of the recessed portion.

2. The cap of claim 1, wherein:
the inert material covers at least some of the recessed portion; and
the inert material is adapted to melt in response to the application of energy.

3. A device, comprising:
a cap comprising a recessed portion; and
a getter comprising an inert material and a reactive material,
wherein the inert material is adapted to respond to energy input by undergoing at least one of a phase change and a morphological change;
wherein the getter is at least partially arranged in the recessed portion; and
wherein the inert material and the reactive material form two separate layers of the getter.

4. The device of claim 3, wherein the phase change comprises melting.

5. The device of claim 3, wherein the recessed portion comprises an interior surface, and wherein between 25% and 90% of the interior surface is covered by the reactive material.

6. The device of claim 3, wherein the recessed portion comprises a pre-reflow cavity which is free of the getter.

7. The device of claim 3, wherein the reactive material is formed as a layer having a thickness in a range from 0.1 micrometers to 10 micrometers.

8. The device of claim 3, wherein:
the recessed portion comprises an interior surface;
the inert material completely covers portions of a surface of the reactive material that are not covered by the cap; and
the inert material covers a portion of the interior surface.

9. The device of claim 3, wherein:
the reactive material comprises particles of a reactive metal or an alkaline metal oxide; and
sizes of the particles are in a range from about 0.1 micrometers to about 200 micrometers.

10. The device of claim 9, wherein the sizes of the particles are in a range from about 0.3 micrometers to about 50 micrometers.

11. The device of claim 3, wherein:
   the getter comprises a blend of the reactive material and the inert material; and
   a weight fraction of the reactive material in the blend is in a range from 10% to 90%.

12. The device of claim 3, wherein the cap comprises a glass material.

* * * * *